Sept. 10, 1946. E. J. MASTNEY ET AL Re 22,790

PRESELECTING MECHANISM

Original Filed April 26, 1941 2 Sheets-Sheet 1

Inventors:
John H. Williams
and Edward J. Mastney
By: Robert L. Kahn Atty.

Sept. 10, 1946. E. J. MASTNEY ET AL Re 22,790

PRESELECTING MECHANISM

Original Filed April 26, 1941 2 Sheets-Sheet 2

Inventors:
John K. Williams
and Edward J. Mastney.
By Robert L. Kahn Atty.

Reissued Sept. 10, 1946

Re. 22,790

UNITED STATES PATENT OFFICE 22,790

PRESELECTING MECHANISM

Edward J. Mastney, Berwyn, and John H. Williams, Chicago, Ill., assignors to Oak Manufacturing Co., a corporation of Illinois Original No. 2,293,299, dated August 18, 1942, Serial No. 390,514, April 26, 1941. Application for reissue January 19, 1944, Serial No. 518,900

10 Claims. (Cl. 74—10)

Figure 1:
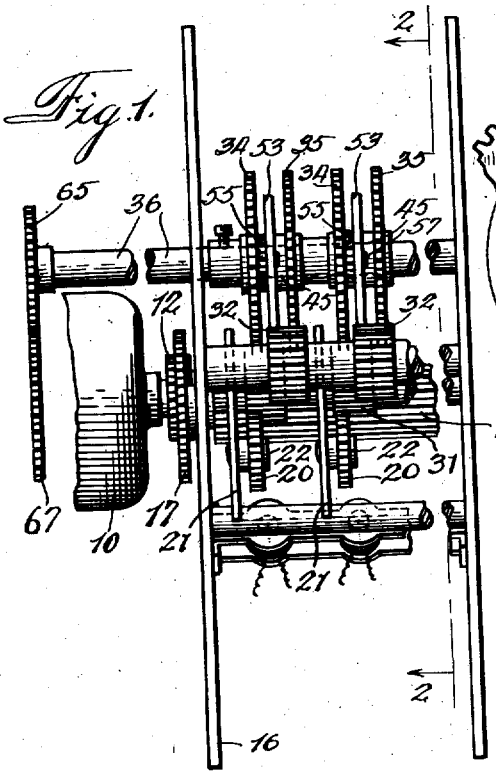

This invention relates to a preselecting mechanism and has particular application to such devices as tuning elements of radio communication systems and other similar devices. In general, this invention may be used where any mechanism or movable member is to be moved quickly and accurately to a preselected position within a range of travel. The invention may be used either with local or remote control and may have a wide range of application.

The invention disclosed herein is an improvement upon the inventions disclosed and claimed in United States Patent No. 2,281,640 to Ten-Cate and Patent No. 2,161,183 to Mastney, particularly the latter. As disclosed in this latter patent, a member to be indexed is positioned by the action of opposing forces set in motion by oppositely revolving gears or the like and communicated to said indexed member through a plurality of coupling means.

In order to increase the accuracy of preselection, it is possible to gear up the preselecting control with relation to the finally preselected shaft. Assuming that a gang condenser in a radio receiver is to be controlled, the finally preselected shaft range is practically 180°. By gearing up the control members, as for example, 10 to 1 so that the preselecting members turn over an 1800° range and choosing positions on a geared up shaft, the accuracy of the system may be greatly increased. Thus if the geared up shaft can be preselected to within 1° then the condenser shaft may be controlled to within one tenth of 1°, assuming of course that the gearing system is accurate.

In the Mastney patent referred to above, the preselecting angular range can be increased as disclosed therein. For moderate increases of the order of as much as 3 to 4 to 1, the means disclosed in said patent is effective and simple. However, if the gearing up factor is to be larger, then the system becomes rather bulky and somewhat cumbersome, requiring excessive plunger travel.

In order to devise a simple and effective means for increasing the travel range of the preselecting members the invention herein has been provided.

Figure 5:
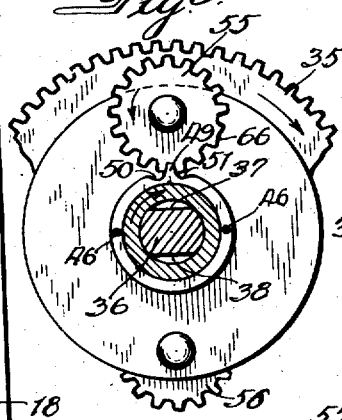
Figure 4:
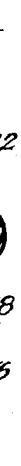
Figure 6:
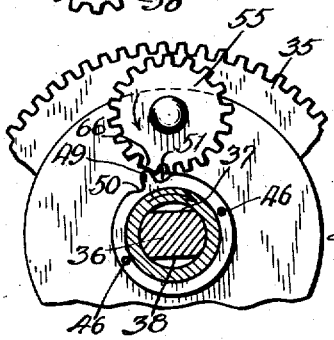
Figure 7:
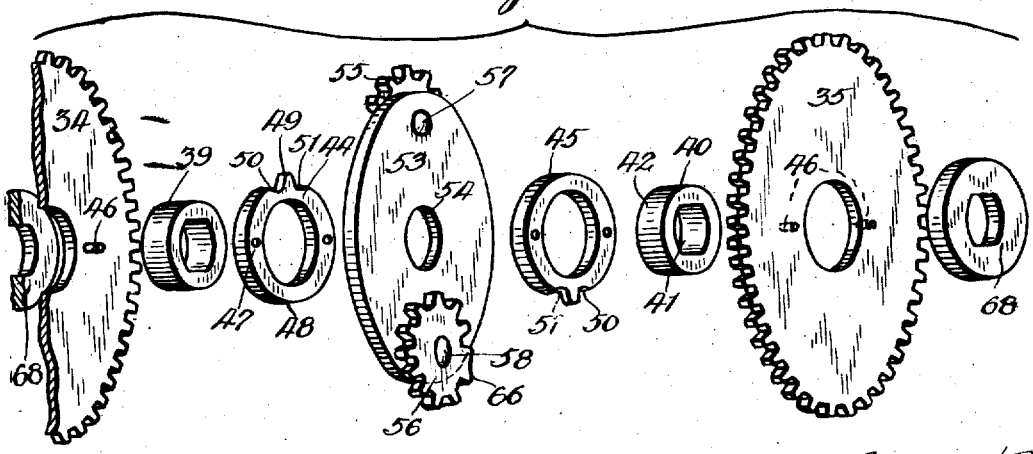
Figure 3:
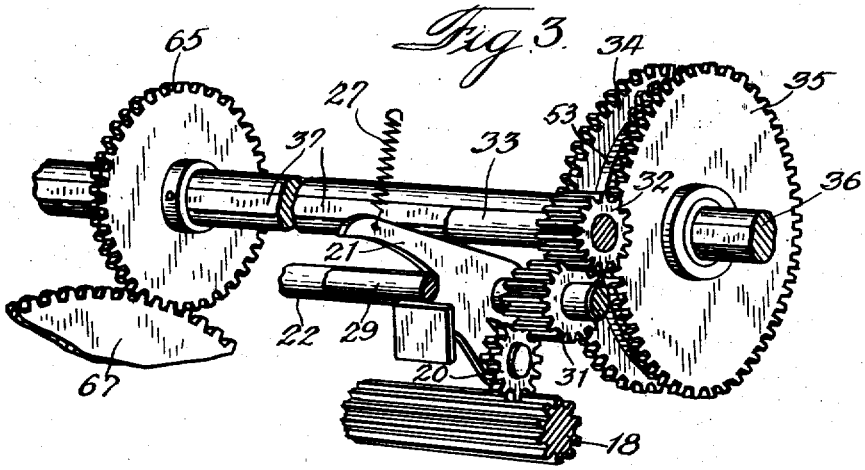
Figure 2:
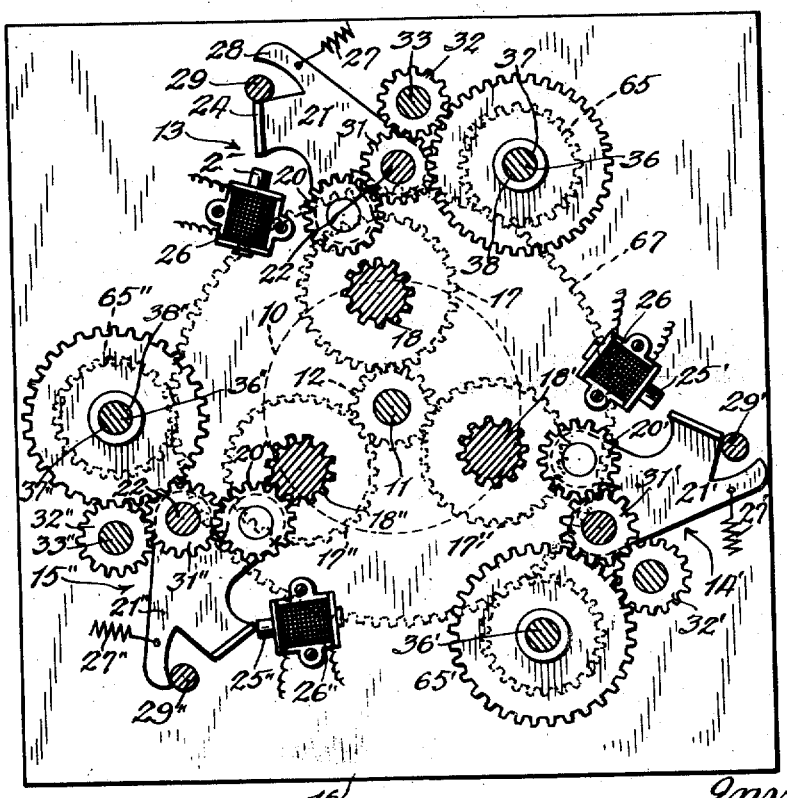

Referring now to the drawings:

Figure 1 is a side elevation of a mechanism embodying the invention; Fig. 2 is a section along 2—2 of Fig. 1; Fig. 3 is an isometric detail of one of the preselector assemblies; Fig. 4 is a detail elevation of a part of a preselector unit; Fig. 5 is a section on 5—5 of Fig. 4; Fig. 6 is a view generally similar to Fig. 5 but showing the parts in a different position; and Fig. 7 is an exploded view of the parts shown in Figs. 4 to 6 inclusive but with the shaft eliminated.

The mechanism shown in Figs. 1 and 2 contains three banks of preselector groups, the banks being similar and the group consisting of a plurality of similar preselector units. As shown in Fig. 1, an electric motor 10 is utilized as a source of power. Motor 10 drives a shaft 11 carrying a pinion 12 around which banks 13, 14 and 15 are grouped. The number and arrangement of banks is unimportant. The entire apparatus may be supported from rigid plates 16 at each end thereof.

Thus referring to one bank, as 13, a plurality of preselecting units are mounted in tandem. Only one unit will be described in detail since the units are duplicated. The motive power for one complete bank is communicated from pinion 12 to a gear 17 which is rigidly fastened to a length of gear stock 18 extending the length of the bank. Inasmuch as gear stock 18 is one continuous length only for convenience and could easily be a single gear for each preselector unit, it will be referred to as gear 18. It is understood that the various members referred to herein are suitably journalled in end plates.

Gear 18 is adapted to be engaged by a pinion 20 rotatably mounted on a bracket 21 pivotally mounted on a rod 22. Rod 22 extends the full length of the bank while bracket 21 and pinion 20 are provided for each preselector unit. It will be noted that bracket 21 has an armature portion 24 adapted to be attracted toward pole piece 25 of an electromagnet 26. Bracket 21 is normally biased away from the electromagnet by spring 27. The angular travel of bracket 21 around rod 22 is determined by a slotted tail piece 28 cooperating with a rod 29.

Rotatably mounted on rod 22 is a gear 31 which is preferably always in mesh with pinion 20 so that when pinion 20 moved into engagement with gear 18, rotation of gear 31 will result upon motor operation. Gear 31 also meshes with a gear 32 rotatably mounted on a rod 33. Gears 31 and 32 are offset along the axis of rotation so that only the adjacent gear sections engage. Each preselector unit has a pair of gears 31 and 32.

Gears 31 and 32 each engage large gears 34 and 35 rotatable around a preselecting shaft 36. The relative gear ratios and gear sizes are of no great consequence. It is desired, however, to turn gears 34 and 35 from motor 10 at equal and opposite speeds.

Referring now particularly to Figs. 4 to 7 inclusive, one preselector unit is shown in detail. The preselecting shaft 36 preferably has a pair of flats 37 and 38 on opposite sides thereof. In order to have gears 34 and 35 freely rotatable around shaft 36, a pair of sleeves 39 and 40 are provided respectively. The inner surface 41 of the sleeves is shaped to match the flattened shaft 36 so that the sleeves can slide along shaft 36, but cannot turn. The outer surface 42 of each sleeve is smooth and provides a rolling surface around which gears 34 and 35 may freely turn.

Adjacent each gear 34 and 35 is a ring member 44 and 45 normally rotatable on sleeves 39 and 40 respectively and adapted to be driven by gears 34 and 35 respectively. As shown here, gears 34 and 35 have pins 46 engaging apertures 47 in the rings. Each ring may be riveted to its adjacent gear or in fact may be formed integral therewith. Each ring 44 and 45 has a circular outer surface 48 interrupted by an outwardly extending finger or gear tooth 49. Tooth 49 extends beyond the space normally outlined by circular surface 48 and between it and the adjacent ends of surface 48 are clearances 50 and 51.

As previously pointed out, rings 44 and 45 are freely rotatable on sleeves 39 and 40 respectively. The opposing ends of sleeves 39 and 40 bear on opposite sides of a coupling member here shown as a disc 53. Disc 53 is provided with a circular aperture 54 just large enough to permit rotation around shaft 36 if sleeves 39 and 40 are backed away from the disc sides. It might be noted here, that the angular position of disc 53 with respect to shaft 36 determines a preselection point for a unit. The turning of disc 53 on shaft 36 is merely to choose or select a particular position for preselection thereafter. Hence for preselector operation disc 53 may be considered as rigid on shaft 36.

On opposite sides of disc 53 and preferably, though not necessarily, diametrically opposite are a pair of gears 55 and 56 rotatably mounted on pins 57 and 58 carried by disc 53. Gears 55 and 56 each have at least one locking section 66 whose angular extent is that of two normal gear teeth.

By having the addendum circle of gear 55, for example, overlap the circle defined by outer surface 48 of cooperating ring 44, a locking action of any two adjacent gear teeth of gear 55 on ring 44 is obtained when the circular surface 48 is opposite the teeth of gear 55. Finger 49 acts like one gear tooth so that for each complete revolution of ring 44, gear 55 is turned through an angle equal to two of its teeth. Thus an intermittent motion is obtained. Gear 55 is locked against idle rotation except when turned by tooth 49.

By having locking section 66 equal in angular extent to two teeth and having an odd number of gear teeth, it follows that locking section 66 will be passed by ring finger 49 once and then be locked on the second encounter in one direction of rotation, as shown in Fig. 6.

It is clear that fundamentally the intermittent movement described herein requires that the ring be the driver and the cooperating gear be driven. This is true even when the gear is revolved around the ring. Since the rings on opposite sides of disc 53 are driven in opposite directions by gears 34 and 35, it follows that gears 55 and 56 will be turned toward locking positions. Before a ring forces a cooperating gear to a locking position, the ring will merely turn. However, if only one ring turns its gear to a locking position then disc 53 will be turned, thus turning shaft 36. As soon as the opposite ring reaches a locking position with its gear, disc 53 will be stopped because of equal and opposing forces. That will determine a preselected position for shaft 36.

It is evident that by having a large number of teeth on gears 55 and 56 that the angular range of each ring between two locked positions may be as great as desired. Thus in the system disclosed, the angular range is equal to 360° times the number of teeth for the cooperating gear, as 55, counting the locking part 66 as two teeth and having an odd number of teeth. If an even number of teeth are provided then the range is half as great since locking part 66 can never pass finger 49, unless incorrectly disposed in which case locking part 66 will never function as a lock.

It is thus clear that shaft 36 has an angular range of travel which is equal to the angular range specified above. This shaft 36 may carry a pinion 65 meshing with a large gear 67 whose angular range is correspondingly reduced.

This reduced range may be 180° if desired for driving a condenser. In actual practice, gear 67 may be a pair of gears with a spring to cause a small angular displacement and eliminate back lash. However means to eliminate back lash are well known. It is assumed that the accuracy of preselection for large gear 67 will not be impaired by poor gear action with small gear 65.

The other banks of units have gears 65' and 65'' meshing with large gear 67. The use of a number of banks in this manner is obviously to reduce the length of each bank in case a large number of total preselector units are desired. Each unit may be adjusted to a preselected position by relieving somewhat the pressure of sleeves 39 and 40 on each disc 53. In order that this may be accomplished, each preselector unit has a separator sleeve 68 on each end, similar to sleeves 39 and 40 but larger. Locking sleeves 39 and 40 are long enough so that they extend a little beyond gears 34 and 35. Hence end sleeves 68, being directly on shaft 36, are kept away from gears 34 and 35 and tend to isolate each preselector unit while permitting free rotation of the parts on sleeves 39 and 50. In practice, sleeve 68 may be extended to form as part thereof adjacent sleeve 39 or 40. Suitable means for maintaining the various sleeves tightly against the cooperating disc 53 of each unit may be provided. Thus an effective means is disclosed in United States Patent No. 2,179,748 to Mastney. Other means may be used if desired.

As disclosed in said patent, the release of compression on the sleeves in one bank will permit all discs 53 in said bank to slip around shaft 36. By operating the preselector unit, i. e. energizing motor 10 and energizing magnet 26 of a unit and also manually forcing shaft 36 to a desired position, a unit may be adjusted to a preselection point. Thus each unit of a bank may be successively adjusted.

In order to ease the shock when a preselected position has been reached, some friction clutch or spring drive between motor 10 and gear 31 may be provided.

What is claimed is:

1. A preselecting mechanism comprising a shaft having a rotational range of over 360°, a coupling member normally rigid on said shaft, a pair of rotary intermittent movements, each movement having a power input and output, each movement including step down means for converting a predetermined angular travel at the input to a smaller angular travel at the output, means on each movement for defining a range of free angular travel, means for supplying power to said movement inputs tending to operate them at equal speeds, each movement including means for transmitting force from the output of said movement to said shaft for shaft rotation when each movement has reached the end of its free travel range, said two movements tending to turn said shaft in opposite directions, and positive locking means for maintaining the relative positions of the parts of each movement to each other and to the coupling member, each movement having a free travel range corresponding to the shaft range, said locking means preventing range displacement and said movements tending to take up the free travel range and thereafter tending to turn said shaft until equal and opposite shaft turning forces define a preselected point.

2. A preselecting mechanism comprising a shaft having a rotational range of over 360°, a coupling member normally rigid on said shaft, a driven toothed member on each side of said coupling member rotatable about an axis parallel and eccentric to said shaft, a driving toothed member for each of said driven members to form two pairs of cooperating toothed members, each driving toothed member forming an intermittent movement with the cooperating driven member, means for positively locking each of said driven members against idle rotation, said locking means and toothed members cooperating and defining an angular range of rotation of said driven members, said ranges being substantially equal to the shaft range and operatively coincident and means for turning said driving members at equal speeds and in a direction to result finally in opposing shaft turning forces, said intermittent movements taking up their respective travel ranges at equal speeds and then turning the shaft until equal and opposite shaft turning forces determine a preselected position.

3. The structure of claim 2 wherein each driven member comprises a gear having a locking section cooperating with the driving member to form the range of travel defining means.

4. The structure of claim 2 wherein each driving member has only one tooth and is rotatable about the shaft.

5. The structure of claim 2 wherein each driven member comprises a gear having a locking section and the driving member is a smooth ring having one tooth, the ring surface cooperating with the gear teeth to form the means for locking the driven member against idle rotation and the locking section to form the range of travel defining means.

6. A preselecting mechanism comprising a shaft rotatable over a range in excess of 360°, a coupling member normally rigid on said shaft, a pair of intermittent movements, each movement consisting of a driven gear having a locking section, and a driver having one tooth and a smooth surface, said one tooth meshing with said gear teeth and the smooth surface cooperating with any two adjacent gear teeth to lock the driven gear against idle rotation, said driven gear locking section determining a range of intermittent motion operation, means for mounting said driven gears to rotate around axes parallel to and offset from the shaft axis, means for operating said two movements at equal rates in opposite directions and means for coupling the movements to said coupling member to apply shaft turning forces after a movement has reached the end of its travel range.

7. A preselecting mechanism comprising a shaft rotatable over a range in excess of 360°, a coupling member normally rigid on said shaft, its rotary position on said shaft determining a preselection point, a gear on each side of said coupling member mounted to rotate on axes offset to but parallel with the shaft, each gear having one locking means which can cooperate with a meshing member to determine a range of gear rotation, a ring member rotatable around said shaft for each gear, said ring member having one tooth for turning the cooperating gear throughout its travel range and cooperating with said locking section to lock the gear at the ends of the range, said ring cooperating with the teeth of the cooperating gear to lock the gear against idle rotation, and means for driving said rings in opposite directions at equal speeds until the preselection point is reached whereupon the equal and opposite shaft turning forces prevent further movement.

8. The combination of claim 7 wherein said shaft is geared to another shaft with a gear step down ratio so that the other shaft has a range of less than 360° and a corresponding increase in preselection accuracy.

9. A preselection mechanism comprising a shaft rotatable over a range in excess of 360°, a coupling member freely rotatable on said shaft, a sleeve on each side of said member for bearing on the sides to lock said member in a predetermined angular position, a gear on each side of said member rotatably carried thereby to rotate in planes perpendicular to the shaft axis, each gear having a locking section extending over an angle of two teeth, a ring freely rotatable on each sleeve for each gear, said ring having a single toothed meshing with the gear and the remaining ring surface cooperating with adjacent pairs of gear teeth to lock the gear against idle rotation, a gear rotatively coupled to a ring, and means for driving the gears in opposite directions at equal speeds.

10. The mechanism of claim 9 wherein a second shaft is geared down from said shaft, said second shaft having a range of travel of less than 360°, the gear ratio of said first to second shaft being less than the number of teeth on each gear carried by the locking member.

EDWARD J. MASTNEY.
JOHN H. WILLIAMS.